United States Patent [19]

Bindner et al.

[11] Patent Number: 4,649,336
[45] Date of Patent: Mar. 10, 1987

[54] AUTOMATIC, SELF SUSTAINING PROBE FOR MEASURING THE WORK FUNCTION

[75] Inventors: Patrick E. Bindner; Eric B. Selkirk; Peter R. Norton, all of Deep River, Canada

[73] Assignee: Atomic Energy of Canada Limited, Ottawa, Canada

[21] Appl. No.: 695,834

[22] Filed: Jan. 29, 1985

[51] Int. Cl.⁴ ............................................. G01R 31/02
[52] U.S. Cl. ...................................... 324/61 R; 324/56
[58] Field of Search ...................... 324/56, 61 R, 61 P, 324/62

[56] References Cited

U.S. PATENT DOCUMENTS

| | | | |
|---|---|---|---|
| 3,187,256 | 6/1965 | Foster | 324/61 R |
| 3,828,607 | 8/1974 | Janzen et al. | 324/56 X |
| 4,072,896 | 2/1978 | Bijlmer | 324/61 P |
| 4,447,782 | 5/1984 | Rutkoski | 324/56 |

FOREIGN PATENT DOCUMENTS

| | | | |
|---|---|---|---|
| 0548801 | 3/1977 | U.S.S.R. | 324/56 |
| 0777804 | 11/1980 | U.S.S.R. | 324/56 |
| 0940078 | 6/1982 | U.S.S.R. | 324/56 |

Primary Examiner—Stanley T. Krawczewicz
Attorney, Agent, or Firm—Alan A. Thomson

[57] ABSTRACT

An apparatus for measuring changes in the work function of a surface using a method devised by Kelvin and known as the "dynamic capacitor method". This apparatus comprises a system for monitoring and automatically regulating the vibration of a Kelvin probe reed assembly during variation of the experimental conditions. This system includes a piezo-ceramic crystal mounted on the probe support rod to detect the vibrations of the reed and a phase locked loop circuit which compares the signal from the piezo-ceramic detector with the signal of the reed drive coil, interprets a change in the reed resonance as a phase shift relative to the coil drive phase and then shifts the coil drive frequency to maintain the correct phase relationship.

14 Claims, 10 Drawing Figures

AUTOMATIC, SELF SUSTAINING PROBE FOR MEASURING THE WORK FUNCTION

FIELD OF THE INVENTION

This invention relates to an apparatus for measuring changes in the work function or "$\Delta\phi$" of a surface and also to a probe to be used in such apparatus. This apparatus is a useful tool for non destructive surface characterization over a wide range of experimental conditions.

BACKGROUND OF THE INVENTION

As defined in the "Electronics Engineers' Handbook, edited by Donald K. Fink and Alexander A. McKenzie, published by McGraw-Hill, 1975, page 1–7" work function is a term applied to the amount of energy required to transfer electrons from the interior of one substance across an interface boundary into an adjacent substance of space. It is commonly expressed by the transfer of an electron across the boundary in units of electron volts. Known in the art is an apparatus for measuring the work function of metal surfaces (U.S. Pat. No. 4,072,896 issue date Feb. 7, 1978, the inventors are Paul Frederik and Adriaan Bijlmer), this apparatus uses a method devised by Kelvin and known as the "dynamic capacitor method". According to this method, a conductive plate is brought into close vicinity of the metal surface under examination in order to create a capacitor formed by such plate and such metal surface. If an external electrical circuit is connected to such capacitor, a flow of electrons will pass through this circuit, and the electrochemical potentials of conductive plate and metal surface are equalized thereby. Nevertheless, an electrostatic potential difference is generated between the two surfaces and the value of this potential difference will be equal to the difference between the work function of both surfaces. Any variation in distance between the conductive plate and the metal surface will cause a capacitance variation in the capacitor. Since the work functions are independent of the capacitor plates spacing, such capacitance variation will be accompanied by a charge variation and will cause an electric current to flow through the external circuit. If the conductive plate is subjected now to periodic vibrations in a direction vertical to the metal surface under examination, this will result in an ac current flowing in the external circuit. The measuring potential generated in this external or measuring circuit is a standard for the work function since the ac current will satisfy the equation $$i = dQ/dt = (dC/dt) \cdot V$$

wherein: i is the output ac current, Q is the electric charge of the capacitor, C is its capacitance and V is the voltage across the capacitor.

Also known in the art is the Kelvin probe apparatus for dynamically measuring the change in work function (Surface Science 83 (1979), page 193.) The operating mechanism of this apparatus is to vibrate a reference electrode also called vibrating reed in close proximity to the surface under examination. The change in separation between the reed and the experimental surface, produces a change in capacitance which in turn generates an ac signal that can be amplified and detected if the work function of the sample and the reed are different. The external measuring circuit of this apparatus comprises a lock-in amplifier, the oscillator of this lock-in amplifier is coupled to the drive reed means so that the lock-in amplifier is referenced to the reed drive frequency which is substantially the reed vibrational frequency. The lock-in amplifier uses the reed drive signal to detect and measure changes in the work function of the surface under examination. The reed of this apparatus can be driven by a variety of methods, including a piezo-ceramic crystal and an electromagnetic coil, at its resonant frequency or some harmonic of the fundamental resonance.

Although, in principle, this method "the dynamic capacitor method" is suitable for measuring the changes in the work function of a surface, there are some problems in the actual practice. If the frequency signal of the driving differs by even a small amount from the resonant frequency, then the reed will stop vibrating. Also the phase relationship between the driving frequency and the reed frequency will change rapidly as the driving frequency moves off resonance.

Non isothermal $\Delta\phi$ experiments in which the experimental surface is heated to high temperature in vacuum or in the presence of a gas, cause heating of the reed by convection or radiation, resulting in a shift of the resonant frequency and consequent change of phase and amplitude. This causes severe problems in the use of a phase sensitive detector also called lock-in amplifier which forms part of a measuring circuit for monitoring $\Delta\phi$.

Experimentally, the drive coil frequency must then be shifted by the appropriate amount to restart the probe, which requires adjustments to the phase sensitive detector. One can appreciate the difficulty in successfully conducting experiments involving large or rapid temperature changes.

There is a need for a system for automatically keeping the reed in resonance regardless of experimental conditions.

There is also a need for a system for monitoring the reed vibrational frequency and amplitude, allowing a quick determination of the proper resonant frequency as well as ensuring that the reed continues to vibrate during the course of the experiments.

SUMMARY OF THE INVENTION

According to one aspect of the present invention there is provided an apparatus for measuring the work functions of a surface sample comprising:
 (a) a reference electrode assembly having a reference electrode for placement over the surface of the sample;
 (b) a drive means activated by a drive signal to vibrate the reference electrode;
 (c) an electric potential measuring circuit connected to the reference electrode for producing a first electrical signal responsive to the electric potential between the reference electrode and the surface of the sample, the first electrical signal being indicative of the work function of the sample when the reference electrode is vibrated at a pre-selected resonant frequency over the sample surface;
 (d) an electromechanical transducer means for detecting reference electrode vibrations and generating therefrom a second electrical signal indicative of the frequency of the vibrations of the reference electrode;
 (e) a feedback circuit for deriving the drive signal from the second electrical signal so that the drive means vibrates the reference electrode substantially at the resonant frequency.

The feedback circuit (e) may comprise a phase locked loop circuit means connected to the electromechanical transducer (d) and to the drive means (b), the phase locked loop circuit means being provided for adjusting the frequency of the drive signal so that the drive signal is kept in phase with the second electrical signal.

A filtering means may be connected between the electromechanical transducer (d) and the phase locked loop circuit means for removing the low frequency noise from the feedback signal.

The feedback circuit (e) may include a reference signal generating means for producing a reference signal based on the frequency of the drive signal, which reference signal is applied to the electric potential measuring circuit means to ensure that the correct phase and frequency relationship between the first signal and the second signal is preserved as the electrode resonant frequency changes.

The drive means (b) may comprise:
 a frequency divider circuit connected to the phase locked loop circuit means for dividing by two the frequency of the drive signal;
 a variable amplifier coupled to the output of the frequency divider circuit; and
 an electromagnetic coil connected to the output of the variable amplifier.

An electrode support may be attached to the reference electrode assembly. A support rod assembly may be held in a fixed position at one end and mechanically connected to the electrode support at the other end.

The electromechanical transducer may be attached at substantially the midpoint between the two ends of the support rod assembly and it may comprise a piezoelectric chip.

The reference electrode assembly may comprise:
 a stainless steel beam made of two elongated segments, one end of the beam being connected to the electrode support; and
 a molybdenum pick-up loop connected at the second end of the stainless steel beam.

A conetic plate may be included in the reference electrode assembly;
 an electrode support may be attached to the reference electrode assembly;
 a support rod assembly may be rigidly supported at its one end and mechanically connected to the electrode support at the other end, the support rod assembly having the electromechanical transducer means attached substantially at the midpoint between the two end; and
 an electromagnetic coil may be included in the drive means, the electromagnetic coil may be mechanically connected to the electrode support for vibrating the reference electrode assembly by means of the conetic plate.

According to a second aspect of the present invention there is provided a method of measuring the work function of a surface of a sample comprising the steps of:
 (i) placing a reference electrode in close proximity to the surface under examination;
 (ii) vibrating with a drive signal the reference electrode at a preselected resonant frequency to generate an ac voltage signal between the reference electrode and the surface;
 (iii) detecting the resonant frequency of the reference electrode which varies with surrounding conditions to generate a feedback signal;
 (iv) using the feedback signal to adjust the frequency of the drive signal to match the resonant frequency of the reference electrode; and
 (v) measuring the work function by sensing the ac voltage signal between the reference electrode and the surface under examination.

The step (iii) of detecting the resonant frequency may further comprise a step of filtering the feedback signal to remove low frequency noise.

The step (v) of measuring the work function may further comprise steps of:
 (vi) generating a reference signal based on the resonant frequency of the reference electrode;
 (vii) utilizing the reference signal directly by controlling the operating frequency of the lock-in amplifier for the derivation of the work function of the surface under examination.

BRIEF DESCRIPTION OF THE DRAWINGS

In the accompanying which illustrate, by way of example, an embodiment of the present invention, FIG. 4 shows the piezo chip signal of the reed and the reference signal in square wave, at 298° K when the phase locked loop is on.

FIG. 6 shows the piezo chip signal and the reference signal in square wave, at 318° K when the phase locked loop is on.

FIG. 8 shows the piezo chip signal and the reference signal in square wave, at 383° K when the phase locked loop is on.

FIG. 10 shows the piezo chip signal and the reference signal in square wave at 423° K when the phase locked loop is on.

DETAILED DESCRIPTION OF THE PREFERRED EMBODIMENT

Figure 1:
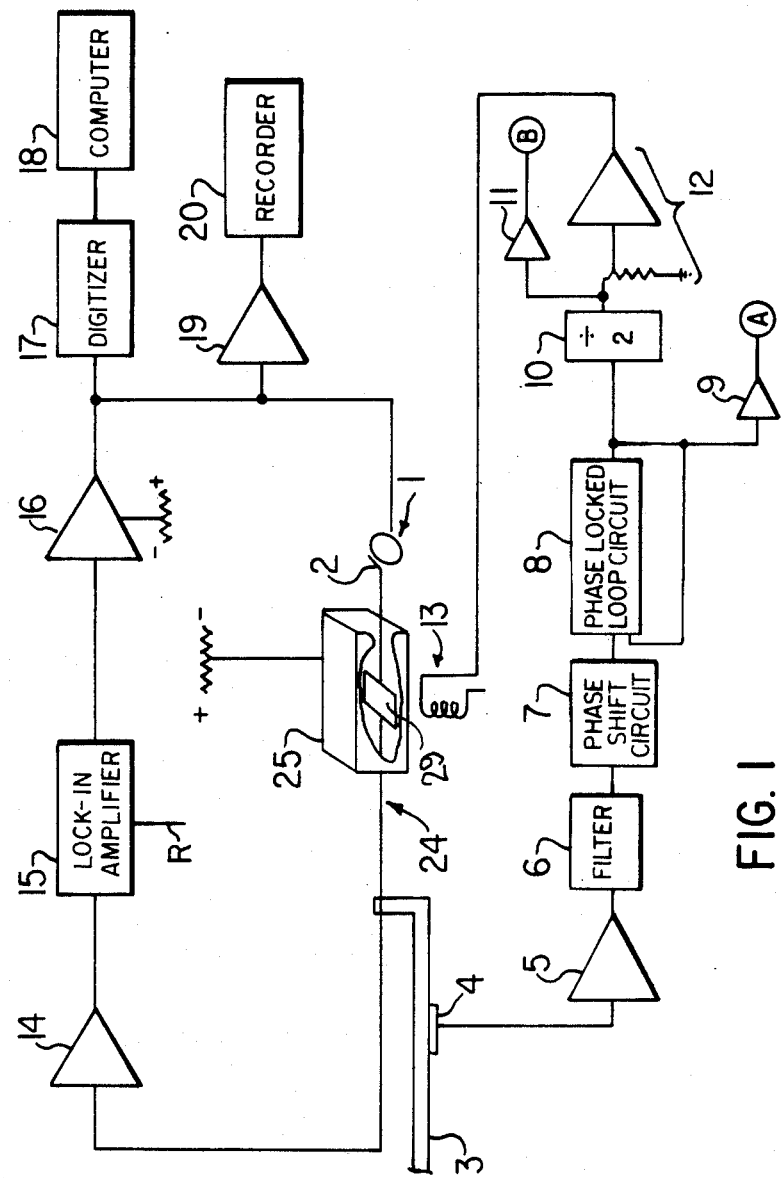
FIG. 1 shows schematically the various parts of the invented apparatus and electric connection between those parts.

Referring now to FIG. 1 there is shown schematically the work function measuring apparatus including a probe.

The apparatus as shown in FIG. 1 comprises a reference electrode assembly in the form of a reed assembly 24 having a reference electrode in the form of a reed 2. An electromagnetic coil 13 vibrates the reed by means of a conetic plate 29 at a preselected resonant frequency. When the resonant frequency of the reed 2 is properly tracked and controlled, a measure of the changes of the work function of a surface 1 under examination is automatically taken. The ac $\Delta\phi$ signal between the reed 2 and the surface 1 is detected and amplified by a measuring circuit which includes a lock-in amplifier 15 and other signal amplifiers 14, 16 and 19.

The lock-in amplifier 15 through a reference terminal R, is connected to the output A of a buffer 9 which supplies a reference signal indicative of the vibrational frequency of the reed 2. The lock-in amplifier 15 generates an output signal indicative of changes in the work function of the surface 1. This output signal is process by a digitizer 17 and sent to a computer 18 and at the same time sent to a recorder 20 through the amplifier 19. The apparatus includes an electromechanical transducer e.g. piezo chip 4, or other similar vibration sensors such as solid state sensors or vibrating-magnet-and-electromagnetic-coil combination, to detect the vibration frequency of the reed 2; and a feedack circuit which is made up among other things of a phase locked loop circuit 8. The feedback circuit is connected to the piezo chip 4 to track the vibration frequency of the reed 2 and generates a coil control signal to be applied to the electromagnetic coil 13. The coil control signal ensures that the reed 2 will vibrate at its selected resonant frequency during variable experimental conditions.

In the apparatus shown, the vibrations of the reed 2 are detected by the piezo chip 4 mounted on a probe support rod 3. The piezo chip 4 picks up the mechanical vibrations of the support rod 3 indicative of the vibrations of the reed 2 and generates an ac signal responsive of the resonant frequency of the reed 2. This ac signal is processed by an amplifier 5 and a filter 6 to remove 60 Hz pick up and low frequency noise. The signal is then sent to a phase shift circuit 7 which shifts the phase of the signal.

The phase shifted output signal is sent to the phase locked loop 8. The phase locked loop generates a signal to drive the electromagnetic coil 13 (coil drive signal). The phase locked loop compares the phase of the coil drive signal with the phase of the phase shifted output signal and adjusts the frequency of the coil drive signal to maintain the correct phase relationship between the phase shifted output signal and the coil drive signal.

The coil drive signal is sent to the lock-in amplifier 15 through a buffer 9 as the reference signal at the terminal R, which ensures that the measurement of the changes in the work function is made with the correct value of the resonant frequencies of the reed 2 as it changes.

The phased locked loop 8 used, could handle signal frequency from 0.01 Hz to 300 KHz. An experiment demonstrates that the frequency of the reed 2 varies from 70 Hz to 950 Hz. The conetic plate 29 is attracted to the drive coil 13 regardless of the polarity, hence each cycle of the drive coil attracts the conetic plate 28 twice, once for the positive half of the cycle and once for the negative half of the cycle. Thus usable range of drive frequencies is from 140 Hz to 1900 Hz.

The phase locked loop 8 is connected to a frequency divider 10 which divides by two the frequency of the coil drive signal. The frequency divider 10 is coupled to a second buffer 11 to produce a second reference signal, if desired, at its output B. This second reference signal could be applied through the terminal R to a lock-in amplifier 15 which can track at twice the frequency of the reference signal in certain applications. The frequency divider 10 is also coupled to a variable amplifier 12 to produce a coil control signal. The coil control signal is a current of 0–400 mA at 5V.

Figure 2:
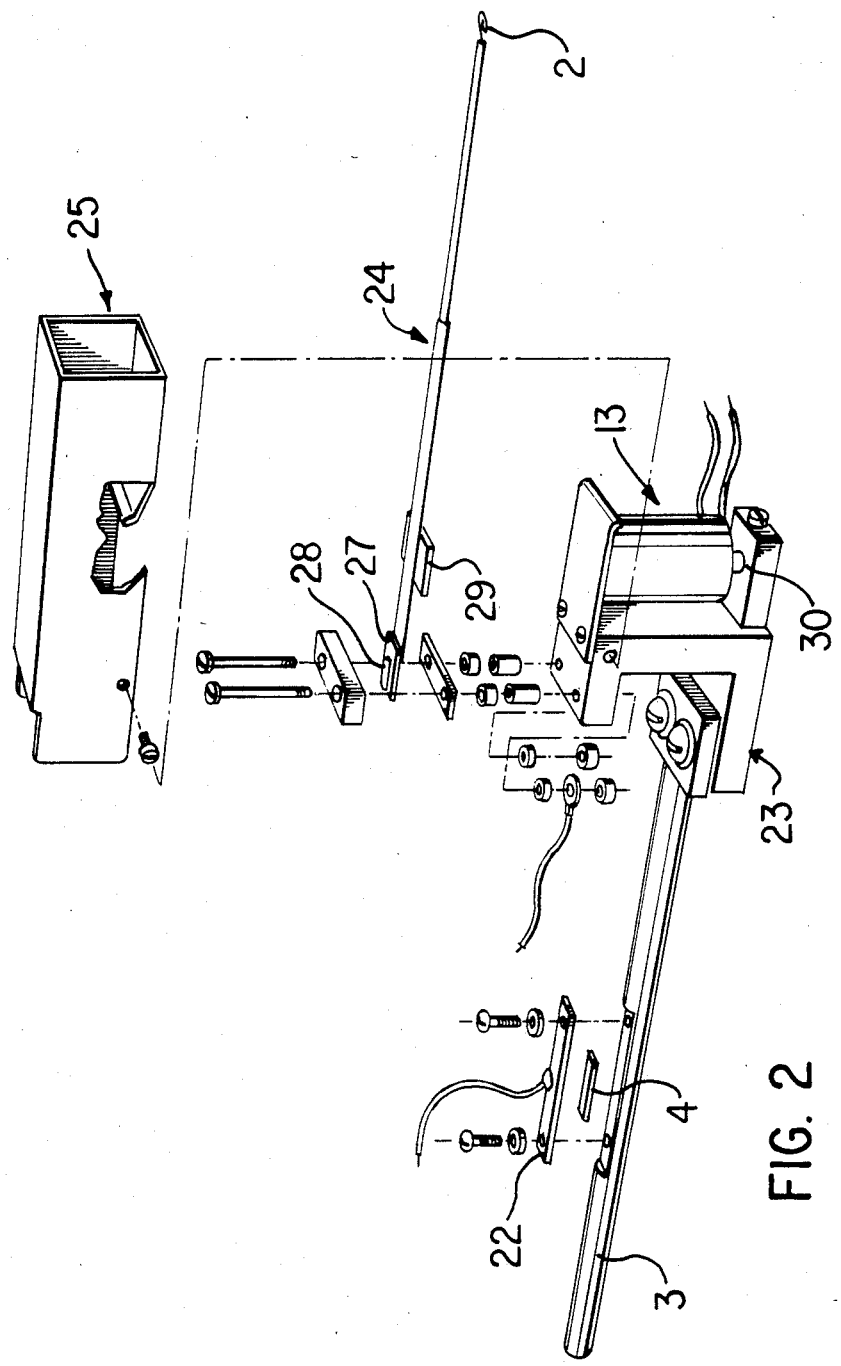
FIG. 2 shows the probe of the apparatus of FIG. 1 in a exploded view.
Figure 3:
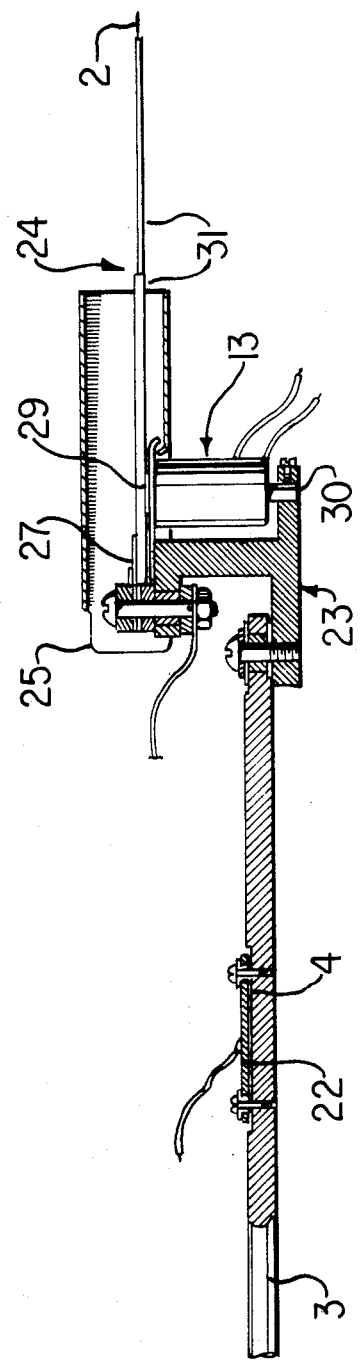
FIG. 3 shows the probe of the apparatus of FIG. 1 in a cross-sectional view.

Referring now to FIGS. 2 and 3, these figures illustrate the probe itself.

The probe support rod 3 is welded to a ultra high vacuum flange at one end and connected mechanically to a stainless steel reed support 23 at the other end. This support rod 3 is 304 stainless steel 4.77 mm in diameter and 10 cm in length. The flat face of the support rod used to accept the piezo chip 4 is machined approximately 0.15 mm in depth and 25 mm in length centered at midpoint of the support rod 3.

Positioning of the probe in a vacuum chamber is accomplished by welding the probe support rod 3 to a 70 mm ultra high vacuum flange equipped with suitable electrical feedthroughs and bolting the flange to a linear motion thimble fitted to the appropriate port of an ultra high vacuum bell jar.

The piezo chip 4 is fabricated from 0.127 mm thick piezo electric material made by Siemens [Trade mark] PTZ H42 which piezo chip 4 is plated on both sides with 60 $\mu g$ cm$^{-2}$ gold layer vacuum deposition. The dimension of the piezo chip 4 are approximately 1.5 mm × 12 mm × 0.127 mm. The piezo chip 4 is clamped on the support rod 3 by a small electrically insulated vice assembly 22. Once mounted, the piezo chip 4 is then polarized with a 300 volt battery.

The stainless steel reed support 23 is connected to the reed assembly 24 and to the drive coil 13 in a manner to permit the drive coil 13 to vibrate the reed assembly 24. A shield 25 is polarized with a DC voltage and attached to the reed support 23 in a manner to shield the reed assembly 24.

The reed assembly 24 is specifically designed to be less sensitive to the temperature changes. This design employs a stiff, low mass, segment tubular stainless steel vibrating beam 31 with a small molybdenum pick up loop at the detection end. The reed assembly 24 has a broad resonance typically ±1 Hz. The resonant frequency of the reed assembly 24 could then be shifted very slightly without producing very large amplitude or phase changes. The reed assembly 24 is fabricated from two 304 stainless steel tubing segments and a 316 stainless steel spring plate 27, with the overall length being 80 mm. The two tubular segments are 29 mm long and 48.4 mm long respectively. These segments are fitted together with an overlap of 4.5 mm, slightly crimped and spot welded. The spring plate 27 is cut from 0.356 mm stainless steel plate 11 mm × 3.5 mm with a 0.754 mm diameter × 5 mm 304 stainless steel locating pin 28 welded to the surface of the plate for locating the read assembly 24 in a clamping vice. The spring plate 27 is spot welded to the steel tube beam on the opposite side of the locating pin 28 with 0.5 mm horizontal distances between the pin 28 and the tubular beam 31.

A magnetic driving plate 29 is spot welded on the tubular beams 31 to 4 mmm from the spring 27 on the opposite side of the tube from the spring 27 and is fabricated from 5 mm × 5 mm conetic sheet metal type AA from the Perfection Mica Company. A pick up loop is spot welded to the detection end of the tubular beam 31 and consists of 0.254 mm diameter molybdenum wire in a planar two turn concentric loop. The drive coil 13 is fixed to the reed support 23 and utilizes a soft iron core. This drive coil 13 is wound with 0.254 mm diameter copper wire insulated with Teflon [Trade-mark] fabricated by Omega Engineering Inc. type TFCP-010. The coils are wound on the upper 16 mm of the core in 6 layers of 29 turns each, and then coated thinly in Varian Torr Seal epoxy [Trade-mark]. The protruding shaft 30 of the core is used to mount the coil in the reed support 23, giving some flexibility in positioning the coil. The copper coil was spot welded to nickel lead-in wires. Alternatively the coil wires themselves could be used as lead-in cables. The test reed was determined to have a strong fundamental vibration at 195 Hz and a useful harmonic at 781 Hz as measured on a frequency counter. With a drive current of 60 mA, the signal level from the piezo detector at 781 Hz was 50 mV with the probe at 293° K in air at atmospheric pressure. The temperature of the probe was raised to 773° K by a wire wound tubular resistance heater enclosing the reed. At 773° K the reed had stopped vibrating visibly and the piezo signal had dropped to less than 1 mV. The experiment was repeated with the phase locked loop in operation. At 293° K the frequency counter indicated 781 Hz with a piezo signal of 50 mV. When the temperature of the reed was raised to 773° K, the drive frequency followed the reed resonance shift to 765 Hz, and the piezo signal was 38 mV. The reed was still vibrating after a frequency shift of 16 Hz. The phase locked loop was then switched off and the reed ceased vibrating immediately, with the drive frequency reverting to 781 Hz.

Subsequent experiments were designed to demonstrate not only the frequency tracking capability of the system, but also the preservation of the phase relationship between the coil drive and the reed resonance. In these experiments the reed performance was monitored on a dual sweep oscilloscope, with the reed vibrations shown by the sinusoidal piezo electric signal on one sweep, and the coil drive as shown by the square wave form from the output of the first buffer on the other sweep.

Figure 4:
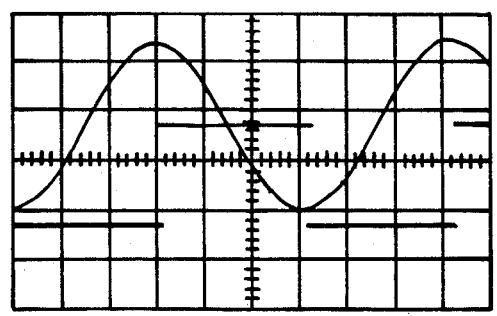
Figure 5:
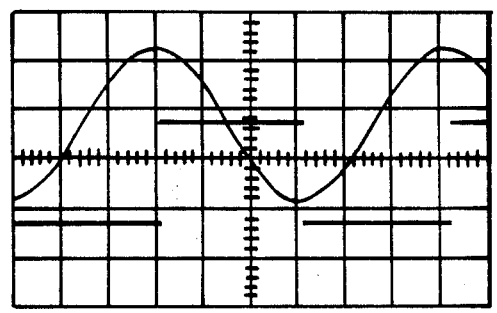
FIG. 5 shows the piezo chip signal of the reed and the reference signal in square wave, at 298° K when the phase locked loop is off.
Figure 6:
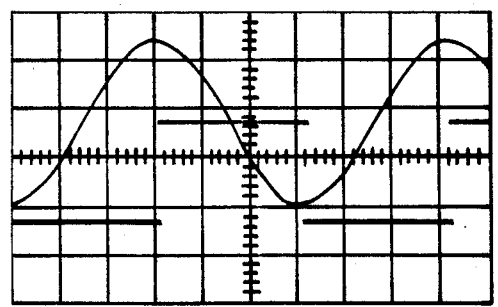
Figure 7:
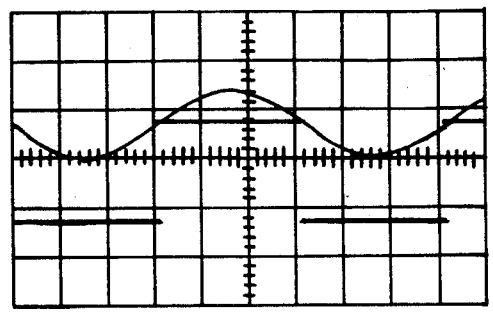
FIG. 7 shows the piezo chip signal and the reference signal in square wave, at 318° K when the phase locked loop is off.
Figure 8:
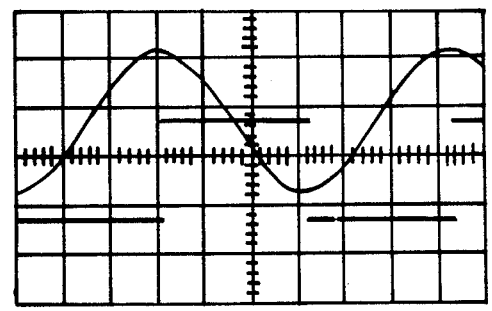
Figure 9:
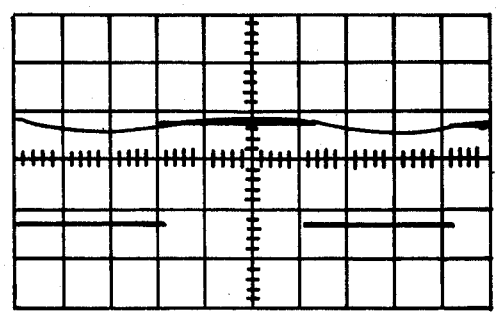
FIG. 9 shows the piezo chip signal and the reference signal in square wave, at 383° K when the phase locked loop is off. The piezo signal indicating cessation of reed function.
Figure 10:
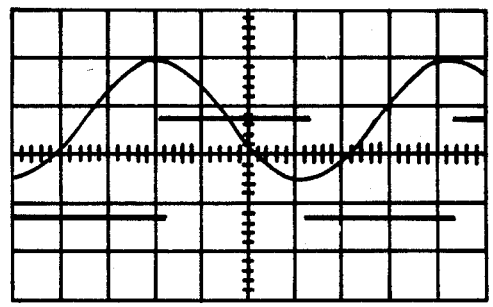

The temperature of the reed was stabilized at 298° K and the oscilloscope trace was recovered via a scope mounted polaroid camera for the phase locked loop mode and the non-phase locked loop mode of operation, with both photographs identical (FIGS. 4, 5,). The experiments were repeated at temperatures of 318° K, 383° K and 423° K, with the results shown in FIGS. 6, 7, 8, 9 and 10 respectively. The non-phase locked loop experiment at 423° K was not conducted because the same experiment at 383° K produced virtual cessation of reed function. A large shift in relative phase is evident in the non-phase locked loop experiments as demonstrated in FIG. 7 while the phase locked loop experiments retain the original phase relationship. The reed resonant frequency shift from the 298° K experiment to the 423° K experiment was 12 Hz, and the reed amplitude reduction was approximately 6.5% in the phase locked loop experiments over the same range. The experimental conditions described above were particularly rigorous since the high pressure (atmospheric) permitted rapid and efficient heat transfer to the reed and hence the greatest perturbations in its vibrational characteristics. Conventional $\Delta\phi$ experimental conditions would involve pressures of $10^{-4}$ to $10^{-9}$ torr, resulting in greatly reduced heat transfer. However, we stress that this Kelvin probe can be used for surface science experiments at high or low pressures, limited only by the construction materials (feedthroughs, etc.). It is virtually the only surface sensitive probe capable of operating at high pressure, with high response speeds.

The modified Kelvin probe and phase locked loop control circuit described herein is capable of easily and successfully conducting $\Delta\phi$ experiments under non-isothermal conditions that widely exceed the capability of previously existing equipment. The establishment and maintenance of reed resonance is greatly simplified by this new system which permits rapid resonance selection and continual monitoring of reed function. The equipment can operate at virtually any pressure from UHV levels to many atmospheres, and at any sample temperature up to the point where thermionic emission interferes with the $\Delta\phi$ signal. All probe components including the piezo-ceramic detector and the drive probe are bakeable to 433° K for vacuum system cleaning. This device opens a range of experimental possibilities to surface scientists that were previously virtually unattainable.

We claim:

1. An apparatus for measuring the work functions of a surface of a sample, comprising:
    (a) a reference electrode assembly having a reference electrode for placement over the surface of a sample;
    (b) a drive means activated by a drive signal to vibrate the reference electrode;
    (c) an electric potential measuring circuit connected to the reference electrode for producing a first electrical signal responsive to the electric potential between the reference electrode and the surface of the sample, the first electrical signal being indicative of the work function of the sample when the reference electrode is vibrated at a pre-selected resonant frequency over the sample surface;
    (d) an electromechanical transducer means for detecting reference electrode vibrations and generating therefrom a second electrical signal indicative of the frequency of the vibrations of the reference electrode;
    (e) a feedback circuit for deriving the drive signal from the second electrical signal so that the drive means vibrates the reference electrode substantially at the resonnant frequency.

2. The apparatus as defined in claim 1 wherein the feedback circuit (e) comprises a phase locked loop circuit means connected to the electromechanical transducer (d) and to the drive means (b), the phase locked loop circuit means being provided for adjusting the frequency of the drive signal so that the drive signal is kept in phase with the second electrical signal.

3. The apparatus as defined in claim 2 wherein a filtering means is connected between the electromechanical transducer (d) and the phase locked loop circuit means for removing the low frequency noise from the feedback signal.

4. The apparatus as defined in claim 1 wherein the feedback circuit (e) includes a reference signal generating means for producing a reference signal based on the frequency of the drive signal which reference signal is applied to the electric potential measuring circuit means to ensure that the correct phase and frequency relationship between the first signal and the second signal is preserved as the electrode resonant frequency changes.

5. An apparatus as defined in claim 1 wherein the drive means (b) comprising:
    a frequency divider circuit connected to the phase locked loop circuit means for dividing by two the frequency of the drive signal;
    a variable amplifier coupled to the output of the frequency divider circuit; and
    an electromagnetic coil connected to the output of the variable amplifier;

6. The apparatus as defined in claim 1, further comprising:
    an electrode support attached to the reference electrode assembly; and a support rod assembly being held in a fixed position at one end and mechanically connected to the electrode support at the other end.

7. An apparatus as defined in claim 6, wherein the electromechanical transducer is attached at substantially the midpoint between the two ends of the support rod assembly.

8. An apparatus as defined in claim 7, wherein the electromechanical transducer comprises a piezoelectric detector.

9. An apparatus as defined in claim 7, wherein the electromechanical transducer comprises a solid state sensor or a vibrating magnet-and-electromagnetic-coil combination.

10. The apparatus as defined in claim 6 wherein the reference electrode assembly comprises:
   a stainless steel beam made of two elongated segments, one end of the beam being connected to the electrode support; and
   a molybdenum pick-up loop connected at the second end of the vibrating beam.

11. The apparatus of claim 1 further comprising:
   a conetic plate included in the reference electrode assembly;
   an electrode support attached to the reference electrode assembly;
   a support rod assembly rigidly supported at its one end and mechanically connected to the electrode support at the other end, the support rod assembly having the electromechanical transducer means attached substantially at the midpoint between the two ends; and
   an electromagnetic coil included in the drive means, the electromagnetic coil being mechanically connected to the electrode support for vibrating the reference electrode assembly by means of the conetic plate.

12. A method of measuring the work function of a surface of a sample comprising the steps of:
   (i) placing a reference electrode in close proximity to the surface under examination;
   (ii) vibrating with a drive signal the reference electrode at a preselected resonant frequency to generate an ac voltage signal between the reference electrode and the surface;
   (iii) detecting the resonant frequency of the reference electrode which varies without surrouding conditions to generate a feedback signal;
   (iv) using the feedback signal to adjust the frequency of the drive signal to match the resonant frequency of the reference electrode; and
   (v) measuring the work function by sensing the ac voltage signal between the reference electrode and the surface under examination.

13. The method as defined in claim 12 wherein step (iii) of detecting the resonant frequency further comprises a step of filtering the feedback signal to remove low frequency noise.

14. The method as defined in claim 12 wherein the step (v) of measuring the work function further comprises steps of:
   (vi) generating a reference signal based on the resonant frequency of the reference electrode;
   (vii) utilizing the reference signal directly by controlling the operating frequency of the lock-in amplifier for the derivation of the work function of the surface under examination.

* * * * *

UNITED STATES PATENT AND TRADEMARK OFFICE
CERTIFICATE OF CORRECTION

PATENT NO. : 4,649,336
DATED : March 10, 1987
INVENTOR(S) : Patrick E. Bindner et al It is certified that error appears in the above-identified patent and that said Letters Patent are hereby corrected as shown below:

Claim 12, column 10, line 13, replace "without surrouding" with "with surrounding".

Signed and Sealed this

Nineteenth Day of January, 1988

Attest:

DONALD J. QUIGG

Attesting Officer

Commissioner of Patents and Trademarks